United States Patent

Wiedmann

[15] 3,657,612

[45] Apr. 18, 1972

[54] INVERSE TRANSISTOR WITH HIGH CURRENT GAIN

[72] Inventor: Siegfried K. Wiedmann, Poughkeepsie, N.Y.

[73] Assignee: International Business Machines Corporation, Armonk, N.Y.

[22] Filed: Apr. 20, 1970

[21] Appl. No.: 29,814

[52] U.S. Cl. ....................317/235, 148/175, 317/235 WW, 317/235 Y, 317/235 AM, 317/235 Z

[51] Int. Cl. ....................H01l 5/00, H01l 11/06, H01l 19/00

[58] Field of Search ................317/235 XA, 235 Y, 235 AM, 317/235

[56] References Cited

UNITED STATES PATENTS

| | | | |
|---|---|---|---|
| 3,502,951 | 3/1970 | Hunts | 317/235 |
| 3,253,197 | 5/1966 | Haas | 317/235 |
| 3,244,950 | 4/1966 | Ferguson | 317/235 |
| 3,338,758 | 8/1967 | Tremere | 148/33.5 |
| 3,226,614 | 12/1965 | Haenichen | 317/235 |

OTHER PUBLICATIONS

Lin, Def. Pub. of Serial No. 769,261, filed Oct. 1968, published in 861 OG 1357, on Apr. 29, 1969

*Primary Examiner*—John W. Huckert
*Assistant Examiner*—William D. Larkins
*Attorney*—Hanifin and Jancin and James E. Murray

[57] ABSTRACT

This specification discloses an inversely operated planar transistor with a high current gain. That is, what is described is a scheme for improving the gain of a planar transistor formed with a base region set within an emitter region and having a collector region within the base region. The higher gain is obtained by placing a heavily doped lateral junction around the periphery of the base so that the main portion of the carrier injections into the emitter occur in a vertical direction to a closely spaced, highly doped, highly conductive buried layer.

5 Claims, 5 Drawing Figures

INVENTOR
SIEGFRIED K. WIEDMANN

BY James E Murray
ATTORNEY

INVERSE TRANSISTOR WITH HIGH CURRENT GAIN

BACKGROUND OF THE INVENTION

This disclosure relates to the structure of transistors and more particularly to the structure of transistors which are inversely operated.

Inversely operated transistors, or in other words, transistors which have a base region set within an emitter region and having a collector region within the base region, are in many cases very useful in reducing the number of isolations and metal connections that must be made in order to make a monolithic transistor circuit. An example of such an inversely operated transistor is shown in copending application, Ser. No. 882,575, filed Dec. 5, 1969, and entitled "Monolithic Semiconductor Memory". In that earlier filed application, two transistors having their emitters connected together and their bases and collectors cross-connected are formed using a common emitter region for both transistors. This saves one isolation zone and a metallic connection over the same configuration using isolated transistors each formed within its own collector region and having a metallic connection to join the two emitters together. So it can be seen that inversely operated transistors are very useful tools in the fabrication of monolithic circuits. Their use has been limited, however, because of their low current gain.

BRIEF DESCRIPTION OF THE INVENTION

Therefore, in accordance with the present invention, a new transistor with high inverse current gain is provided. This new transistor has a heavily doped junction around the vertical sides of the base while the bottom of the base junction is exposed to a highly conductive buried layer. This results in a considerable increase in the gain of the transistor, apparently because it limits the lateral movement of current through the vertical sides of the base-to-emitter junction and instead causes the main part of the carrier injections to occur in the vertical direction which is the much shorter electrical path through the emitter region. Another advantage of the decrease in lateral movement caused by the heavily doped junction is that it reduces lateral transistor effects common in transistors sharing a common region. Preferably, the heavily doped junction around the vertical sides is formed by a highly doped conductivity zone laid down around the base at the same time as the collector for the transistor or any other N+ diffusion is fabricated so as to eliminate the need for any additional process steps.

Therefore, it is an object of the present invention to increase the inverse gain of a vertical transistor.

It is another object of the present invention to improve the gain of inversely operated transistors.

Other objects of the invention are to reduce the number of interconnections, diffusions and isolation zone needed in manufacturing monolithic circuits and to reduce the overall area of the monolithic circuits required on a monolithic chip.

DESCRIPTION OF THE DRAWINGS

These and other objects, features and advantages of the invention will be apparent from the following more particular description of the preferred embodiments of the invention as illustrated in the accompanying drawings, of which:

Referring to FIGS. 1 and 2, an N-epitaxial layer 10 is grown on a P-substrate 12 after an N+ buried layer 14 has been diffused in the substrate. Once the epitaxial growth is complete, an annular P+ diffusion 15 is made through the epitaxial layer 10 into the substrate 12 to define an isolation region 17 of N-material. This isolation region serves as the emitter of the new transistor and P-base diffusion 16 is made into it above the buried layer 14 so that it contacts the buried layer 14 where the buried layer has up-diffused into the epitaxy region 10. Once the diffusion of the base is complete a collector region 18 and an emitter contact region 20 are simultaneously diffused into the base region 16 and the N-portion of the isolation region 17, respectively. In accordance with the present invention, in the same diffusion step as used to form the collector region 18 and the emitter contact region 20, an additional N+ diffusion ring 22 is placed around the base region 16 in the same diffusion step as is used to form the collector region 18 and the emitter contact region 20. This diffusion ring 22 forms a highly doped junction with the vertical sides *a,b* and *a',b'* of the base region 16 which reduces the current flowing through the vertical sides *a,b* and *a',b'* of the base of the completed transistor. This results in a larger portion of the total current supplied to the buried layer flowing vertically through the horizontal surface *a', b'* of the base. With the vertical injection proportionably larger, the current gain of the inverse transistor is increased. With the diffusion complete contacts 24, 26 and 28 are fabricated for the collector, base and emitter connections, respectively.

FIGS. 3 and 4 show a number of transistors with a common emitter region formed in accordance with the present invention. It will be noted that the difference between these transistors and the transistor described in connection with FIGS. 1 and 2 is that the junction ring 22 and the emitter contact diffusion 20 are unitarily formed and commonly numbered 20–22. Otherwise, the numbers used with respect to FIGS. 1 and 2 are used to denote the same diffusions in these figures except the suffixes *a, b* and *c* are used in connection with the base and emitter diffusions and contacts to indicate that they are for three different transistors. The lateral dimensions on the transistors can be easily determined from the scaling mark 30 which represents 1-mil length while the vertical dimensions of the different diffusions and layers are listed below along with the impurity concentrations of the various diffusions.

| | |
|---|---|
| Depth of horizontal collector junction from top surface | 40$\mu$ inch |
| Depth of horizontal emitter junction from top surface | 30$\mu$ inch |
| Base width | 10$\mu$ inch |
| Thickness of the epitaxial layer | 140$\mu$ inch |
| Thickness of the subcollector diffusion | 200$\mu$ inch |

Figure 1:
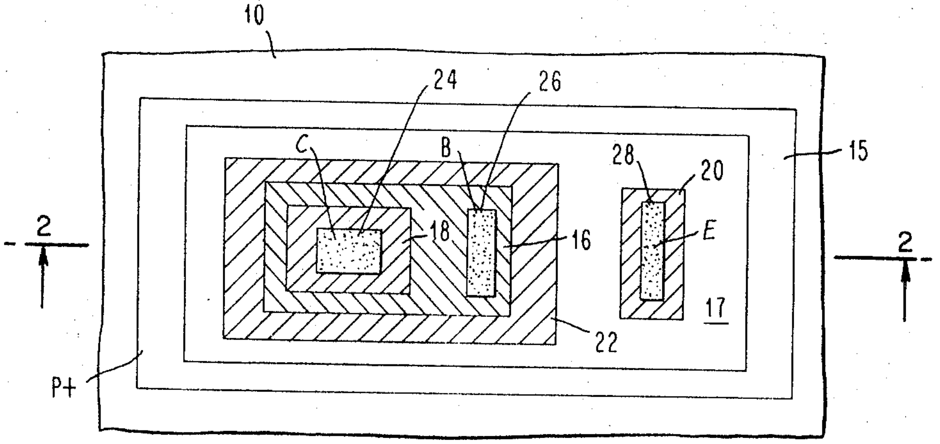
FIG. 1 is a planned view of the transistor incorporating the present invention.
Figure 2:
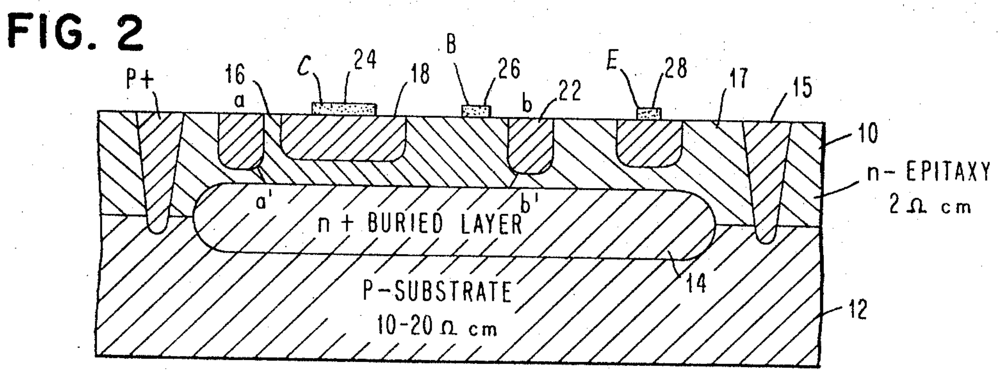
FIG. 2 is a section taken along lines 2—2 in FIG. 1.
Figure 5:
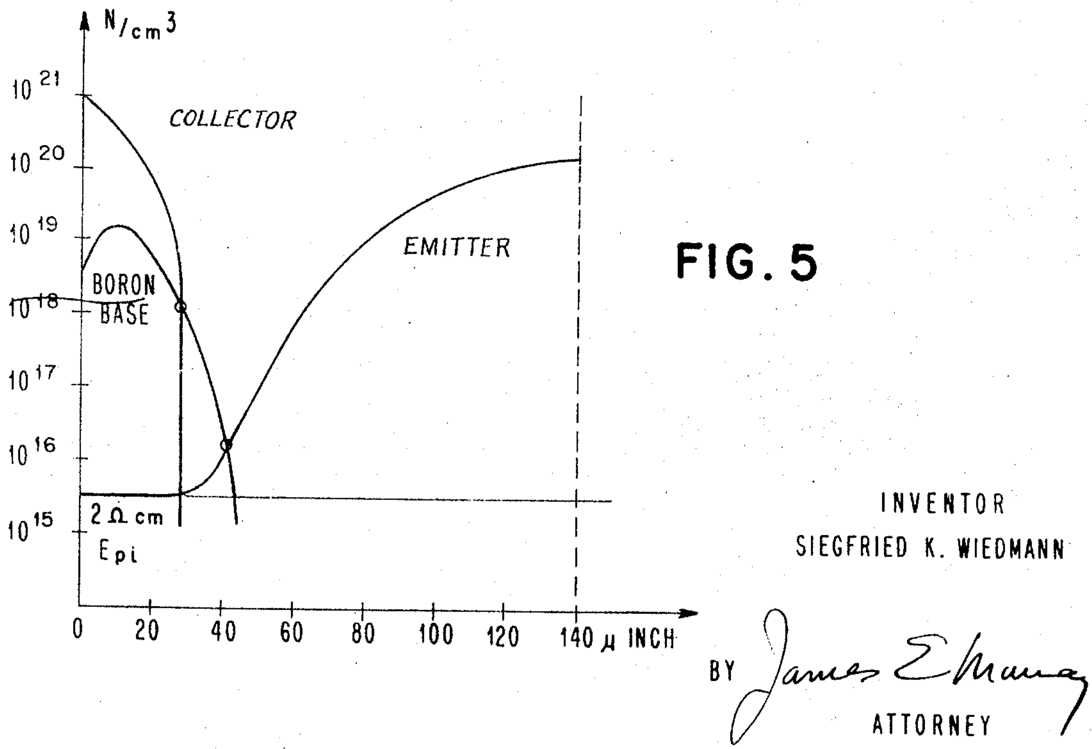
FIG. 5 is a profile graph of the impurity concentrations of the transistors shown in FIGS. 3 and 4.
Figure 3:
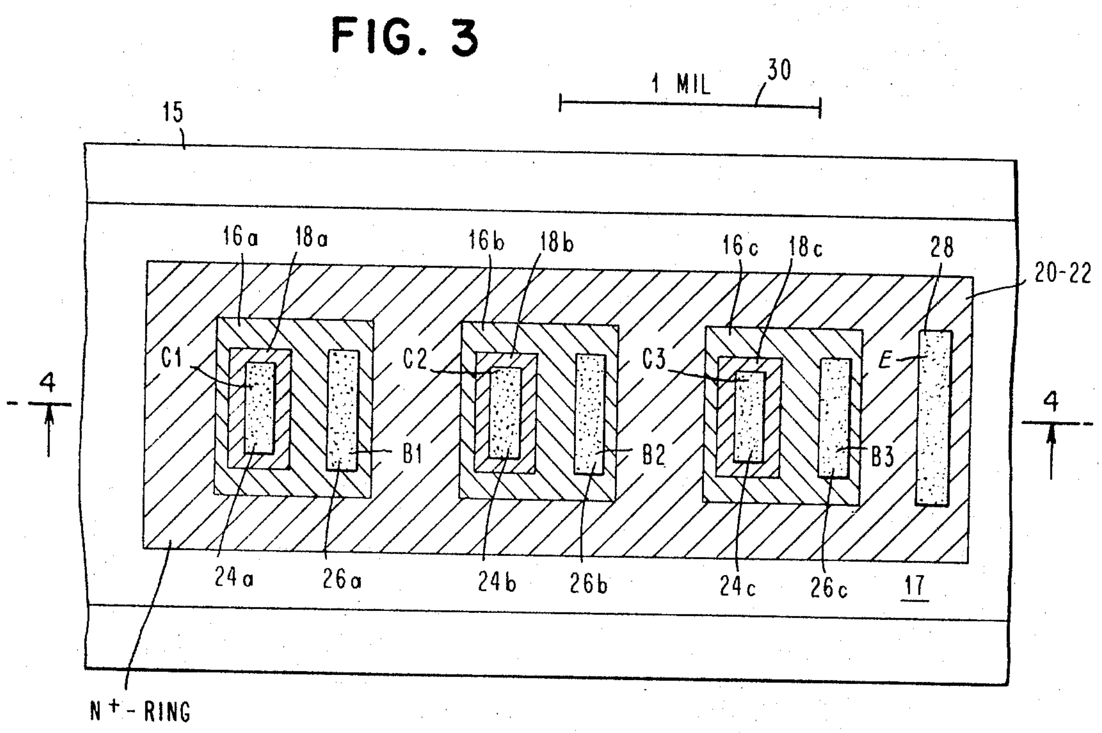
FIG. 3 is a planned view of three transistors sharing a common emitter zone and incorporating the present invention.
Figure 4:
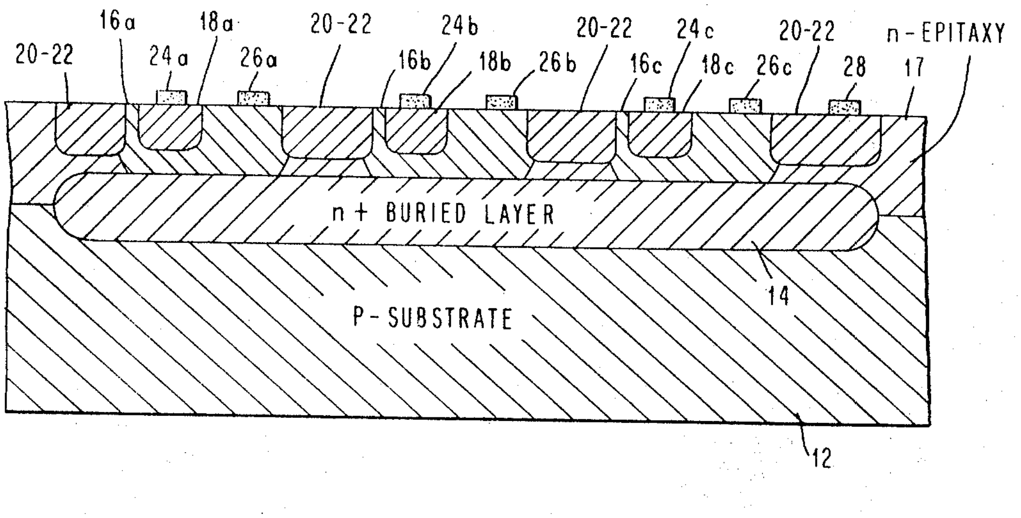
FIG. 4 is a section taken along lines 4—4 in FIG. 3.

FIG. 5 is a profile graph of the impurity concentration of the transistors shown in FIGS. 3 and 4 while the initial and junction impurity concentrations for the base and emitters are listed below.

starting collector impurity concentration ($C_{OE}$) $1.2 \times 10^{21}$ A./cm.$^3$ starting base impurity concentration ($C_{OB}$) $2.0 \times 10^{19}$ A./cm.$^3$ impurity concentration at emitter junction $(C(X_{JC}))\ 3.5 \times 10^{16}$ A./cm.$^3$ impurity concentration at collector junction $(C(X_{JE}))\ 1.0 \times 10^{18}$ A./cm.$^3$ From the graph below you can see that the transistors shown in FIGS. 3 and 4 result in improvement of the beta $B_I$ for these inverse transistors of approximately two to three when using the two collector-to-emitter voltages shown and an emitter current of 200 amps over the same transistor without the N+ junction ring 20–22.

| | $B_I$ at $V_{CE} = 200\ mv$ | $B_I$ at $V_{CE} = IV$ |
|---|---|---|
| $T_r$ without N+— ring | 2.8 | 5.5 |
| $T_r$ with N+— ring | 7.5 | 11 |

Therefore, it can be seen that the N+ ring provides a means to increase the inverse current gain of an NPN-transistor without any process change. Thus a sufficiently high beta for an inverse transistor is obtained to insure their broader application.

In the illustrated examples the N+ ring 22 or 20–22 completely surrounds the base region 16. While this is preferable in some applications it may be desirable to use a ring that only partially surrounds the sidewall. Furthermore, while the base region contacts the subcollector in the illustrated examples, it should be apparent that the invention is equally applicable to transistor structures where the subcollector is not so contacted by the base.

Therefore, while the invention has been shown and described with respect to preferred embodiments thereof, it will be understood by those skilled in the art that various changes in form and details may be made therein without departing from the spirit and scope of the invention.

What is claimed is:

1. In an inverse vertical planar transistor structure having a base area of one conductivity kind positioned within an emitter area of another conductivity kind and having a collector area of said other conductivity kind within the base area the improvement comprising a zone of the other conductivity kind with a higher impurity concentration than the emitter area positioned between the sidewalls of the base area and the emitter area having an emitter contact region spaced laterally from said zone to form a heavily doped junction between the sidewalls of the base area and the zone to thereby increase the gain of the inverse vertical planar transistor.

2. The inverse transistor of claim 1 wherein said zone and the collector area are diffusions formed in the same diffusion step.

3. The inverse transistor of claim 2 including a buried layer under the base diffusion.

4. The inverse transistor of claim 3 wherein the buried layer contacts the bottom of the base area and forms a junction therewith.

5. The inverse transistor of claim 4 wherein the base area is a P-material, said zone, the collector area and the buried layer are N+ material and the emitter area is N-material.

* * * * *